(12) United States Patent
Kim

(10) Patent No.: US 6,518,597 B1
(45) Date of Patent: Feb. 11, 2003

(54) IR SENSOR AND METHOD FOR FABRICATING THE SAME

(75) Inventor: In Sik Kim, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/712,933

(22) Filed: Nov. 16, 2000

(30) Foreign Application Priority Data

Nov. 22, 1999 (KR) ............................................. 99-51994

(51) Int. Cl.$^7$ ................................................. H01L 27/15
(52) U.S. Cl. ......................... 257/82; 257/80; 257/415; 257/419; 257/428; 257/431; 257/447
(58) Field of Search .......................... 257/80, 82, 415, 257/419, 428, 431, 447, 460

(56) References Cited

U.S. PATENT DOCUMENTS

| | | | |
|---|---|---|---|
| 5,100,479 A | * | 3/1992 | Wise et al. .................. 136/225 |
| 5,156,688 A | * | 10/1992 | Buhler et al. ................ 136/211 |
| 6,163,061 A | * | 12/2000 | Iida .............................. 257/467 |

FOREIGN PATENT DOCUMENTS

| | | | |
|---|---|---|---|
| JP | 02205729 A | * | 8/1990 |
| JP | 02205730 A | * | 8/1990 |
| JP | 02219286 A | * | 8/1990 |

* cited by examiner

Primary Examiner—Nathan J. Flynn
Assistant Examiner—Remmon R. Fordé
(74) Attorney, Agent, or Firm—Fleshner & Kim, LLP

(57) ABSTRACT

Infrared ray sensor and method for fabricating the same, the method including the steps of (a) forming a diaphragm on a substrate, (b) forming and patterning a semiconductor film on the diaphragm to form a first thermoelectric material film, and forming and patterning a conductor film on the diaphragm, to form a metal resistance layer in a region of the first thermoelectric material film and a second thermoelectric material film in a region of the diaphragm, (c) forming a protection film on an entire surface inclusive of the metal resistance layer, (d) forming a black body on the protection film, and (e) removing a back side portion of the substrate, to expose the diaphragm, whereby maintaining a high sensitivity, requiring no additional process, reducing Jhonson noise, and improving yield.

8 Claims, 6 Drawing Sheets

IR SENSOR AND METHOD FOR FABRICATING THE SAME

BACKGROUND OF THE INVENTION

1. Field of the Invention

The present invention relates to an infrared ray sensor of a low resistance and a high sensitivity, and a method for fabricating the same.

2. Background of the Related Art

In general, in the infrared ray (IR) sensor for sensing an emitted energy, there are photonic type sensors of photovoltaic effect or photoconductive effect, and thermal type sensors, such as bolometers, pyroelectric sensors, and thermopile sensors. The photonic type sensors, using an electric characteristic change of a sensor coming from exited electrons caused by an incident radiation, has an excellent sensing capability and a fast responsibility, within a selected wavelength range. However, the photonic type sensors has process technologies which have not yet been established fully, are expensive, and operative below a liquid-$N_2$ temperature. Recently, thermal type sensors which can be used commercially, and industrially are developed. The thermal type sensor requires no cooling, and are inexpensive, and reliable, and provides usefull information on bodies which can not be known by means of a visible image. The thermal type sensors has applications in fields of production examination, process monitoring, non-contact, non-destructive testing, and the like. However, even the thermal type sensors, not only have process technologies which have not yet been matured fully, but also have a high cost of substrate and uniformity which are problems to be solved. Consequently, the thermopile sensors are under active study, which can resolve the above problems, and fabrication of which is possible by using an available semiconductor fabrication process. The thermopile sensor uses the Seebeck effect in which a thermoelectric power is generated in proportion to a temperature difference if there is the temperature difference between one sides of two different conductors or semiconductors which are in contact and the other sides thereof which are opened, which can be expressed as an equation shown below.

$$V_{AB} = N \int_{T_A}^{T_H} (a_A - a_B) dT$$

Where, $a_A$ and $a_B$ denote Seebeck coefficients of the two materials in the thermopile, $T_A$ and $T_B$ denote temperatures of contact portions and opened portions of the materials, and N is a number of couples connected. As can be known from the equation, what are required for greater output of the sensor are a greater difference of Seebeck coefficients of the two materials, a greater temperature difference between the contact portion and the opened portion, and many numbers of the couples. As shown in FIGS. 1~4, for satisfying those conditions, an array in which thermocouples are connected in series are fabricated, each formed of different materials having great thermoelectric powers and opposite polarities, disposed in a hot region and a cold region insulated from the hot region, alternately. In general, the cold region is disposed on a massive support for an effective heat sink. That is, the thermopile is two different thermoelectric materials disposed on a thin diaphragm having a low thermal conductance and a low thermal capacitance. Such a structure can enhance a performance of a detector and permits to reduce cost per a detector by means of a batch fabrication. Thin film thermopiles are used in various fields, and are the most general detectors used in IR spectrometers, presently. In summary, of the conditions for enhancing sensor outputs, it is difficult to control the second and third conditions as they are significantly influenced from a structure and a size of the thermocouples. And, meeting the first condition requires selection of appropriate materials. Thermoelectric materials for use in thermopiles are required to have a high electric conductivity for reducing a thermal noise and minimizing a Joule's heat loss, and a low thermal conductivity for minimizing a thermal conduction between the hot junction and the cold junction. However, such problems can not be coexistence, and a relation defined as $Z=\sigma a^2/k$ is used in selection of an appropriate material for fabrication of the thermopiles. The above equation is not so advantageous for metals with small Seebeck coefficients. A heavily-doped semiconductor has a high 'Z' value, and therefore, is an optimal thermoelectric material. The semiconductor has a relationship between the doping concentration and the Seebeck coefficient. That is, though a heavy doping is required for dropping an internal resistance of the sensor, the heavier the doping, the smaller the Seebeck coefficient. Therefore, an optimal condition should be fixed taking the Seebeck coefficient and the sensor internal resistance into account on the same time. And, one another matter to take into account in selection of the thermoelectric material for use in fabrication of the thermopile is selection of a thermoelectric material suitable for mass production. That is, great Seebeck coefficients of the two materials can not be only condition for selecting as the thermoelectric materials for the thermopile. Thermoelectric materials used widely currently in this reason is a doped polysilicon and aluminum. As those materials are used in CMOS fabrication process, in fabrication of the thermopile sensor, an existing CMOS mass production process can be used as it is. In such a thermopile sensor, a black-body formed close to a hot junction of an IR sensor absorbs an incident infrared ray, and a temperature component in the cold junction portion is heat sunk through silicon, to cause a temperature difference between the hot junction and the cold junction, that excites an electromotive force.

However, referring to FIG. 2, the related art thermocouple sensor having a resistance of a first thermocouple material of a semiconductor and a resistance of a second thermocouple material of a metal connected in series, which form an equivalent circuit, has a substantially great internal resistance owing to the resistance of the semiconductor. In noise components affecting operation of the related art thermopile sensor, there are a thermal coupling which is a thermal noise coming from an environment, a radiative coupling which is a noise coming from environmental infrared ray emission, and an electrical noise occurred when an application circuit is formed. The thermal coupling and the radiative coupling, components coming from a sensor operative environment, are not easy to solve. However, the electrical noise has a Jhonson noise expressed as the following equation as a major electrical noise source because the electrical noise has major impedance component of the thermopile sensor as a resistance component.

$$V_J = (4kTRB)^{1/2},$$

where, $V_J$ denotes a Jhonson Noise voltage, k denotes the Boltzmann constant($1.38 \times 10^{-23}$J/K), T denotes an absolute temperature constant K, R denotes a device resistance, and B denotes a nosie bandwidth. Therefore, as can be known from the above equation, it is required to reduce the internal resistance of the sensor for reducing the noise.

SUMMARY OF THE INVENTION

Accordingly, the present invention is directed to an infrared ray sensor and a method for fabricating the same that substantially obviates one or more of the problems due to limitations and disadvantages of the related art.

An object of the present invention is to provide an infrared ray sensor and a method for fabricating the same, which can reduce an internal resistance of the sensor and maintain a high sensitivity.

Another object of the present invention is to provide an infrared ray sensor and a method for fabricating the same, which can improve a thermal noise and enhance a yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the infrared ray sensor including a substrate having a hole in a central region, a diaphragm formed on the substrate, a first and a second thermoelectric materials formed in regions of the diaphragm, a metal resistance layer formed in a region of a surface of the first thermoelectric material, and a black body formed in a central region of the diaphragm.

The first thermoelectric material is a semiconductor, and the first thermoelectric material is a conductor.

The metal resistance layer has a form of at least one stripe.

In another aspect of the present invention, there is provided a method for fabricating an infrared ray sensor, including the steps of (a) forming a diaphragm on a substrate, (b) forming and patterning a semiconductor film on the diaphragm to form a first thermoelectric material film, and forming and patterning a conductor film on the diaphragm, to form a metal resistance layer in a region of the first thermoelectric material film and a second thermoelectric material film in a region of the diaphragm, (c) forming a protection film on an entire surface inclusive of the metal resistance layer, (d) forming a black body on the protection film, and (e) removing a back side portion of the substrate, to expose the diaphragm.

The formation of a metal conductor on the first thermoelectric material permits to reduce an internal resistance significantly, and maintain a high sensitivity.

The easy adjustment of the internal resistance of the sensor by adjusting a length of the metal conductor can improve a production yield since a range of error can be made smaller.

It is to be understood that both the foregoing general description and the following detailed description are exemplary and explanatory and are intended to provide further explanation of.the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 5:
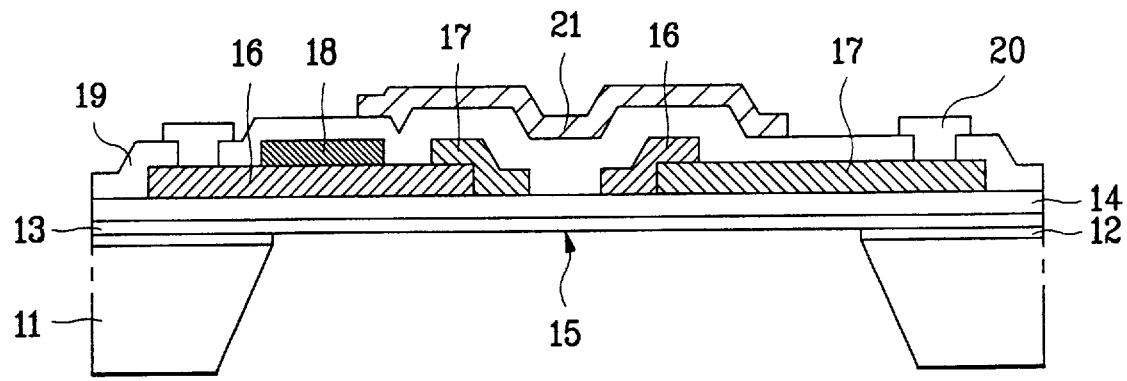
FIGS. 5 and 6 illustrates a section and a plan showing a structure of a thermopile sensor in accordance with a first preferred embodiment of the present invention.
Figure 6:
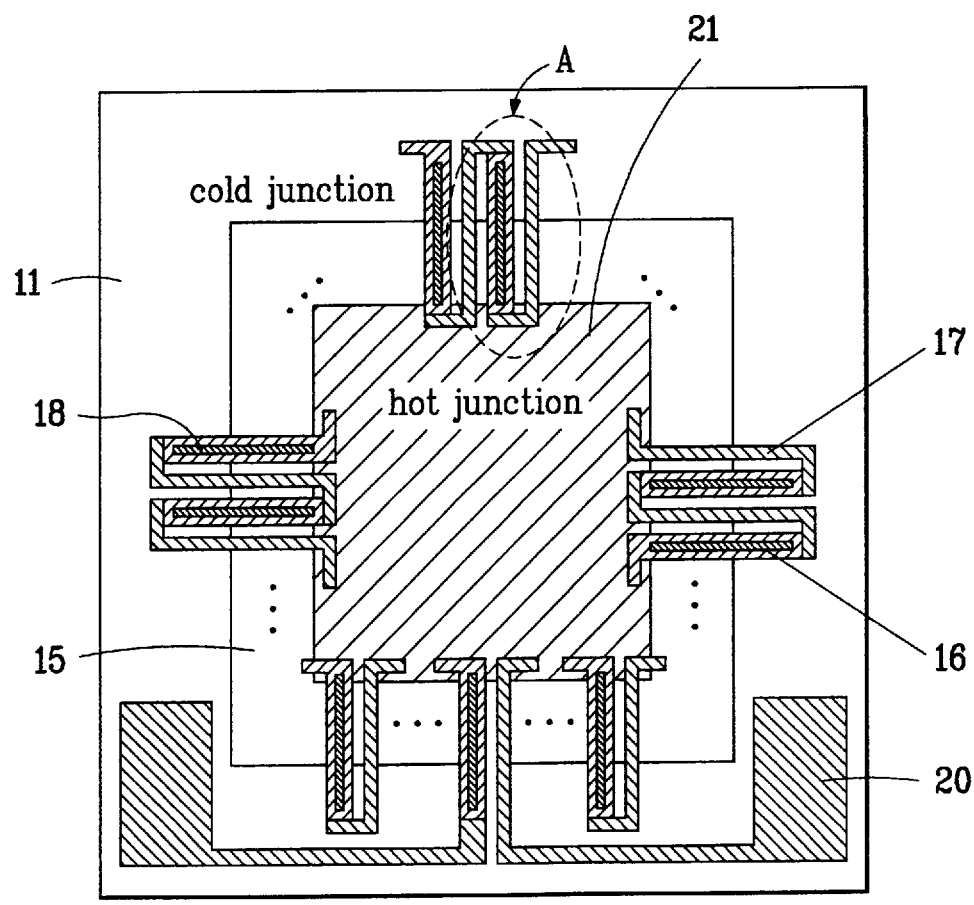

Reference will now be made in detail to the preferred embodiments of the present invention, examples of which are illustrated in the accompanying drawings. FIGS. 5 and 6 illustrates a section and a plan showing a structure of a thermopile sensor in accordance with a first preferred embodiment of the present invention.

Referring to FIGS. 5 and 6, the thermopile sensor in accordance with a first preferred embodiment of the present invention includes a silicon substrate 11 having a central portion etched to expose a thin diaphragm 15 of a first oxide film 12, a nitride film 13, and a second oxide film 14, and a plurality of thermocouples of a first thermoelectric material 16 and a second thermoelectric material 17 connected in series. The first thermoelectric material 16 is a semiconductor, and the second thermoelectric material 17 is a conductor, both having a great thermoelectric power of opposite polarities. And, there is a metal conductor 18 with a low resistance formed on the first thermoelectric material 16 for reducing a resistance of the device. The metal conductor 18 is of a material the same with the second thermoelectric material 17 in a form of a stripe. The metal conductor 18 is formed on a surface of the first thermoelectric material 16 not in contact with the second thermoelectric material 17. Each of the thermocouples has a hot junction disposed on an hot region and a cold junction disposed on a cold region, which hot junction and cold junction are thermally isolated to each other. In general, the cold junction is disposed on the silicon substrate 11 for heat sink, and there is a black body 21 close to the hot junction for absorbing an infrared ray. Though the present invention is similar to the related art, the present invention is different form the related art in that there is a metal conductor 18 formed on the first thermoelectric material 16 for reducing an internal resistance of the device. As shown in FIGS. 5 and 6, a basic concept of the present invention is stacking a metal on a semiconductor, the first thermoelectric material which affects the internal resistance of the device, for reducing the internal resistance of the device based on the related art thermopile sensor.

Figure 1:
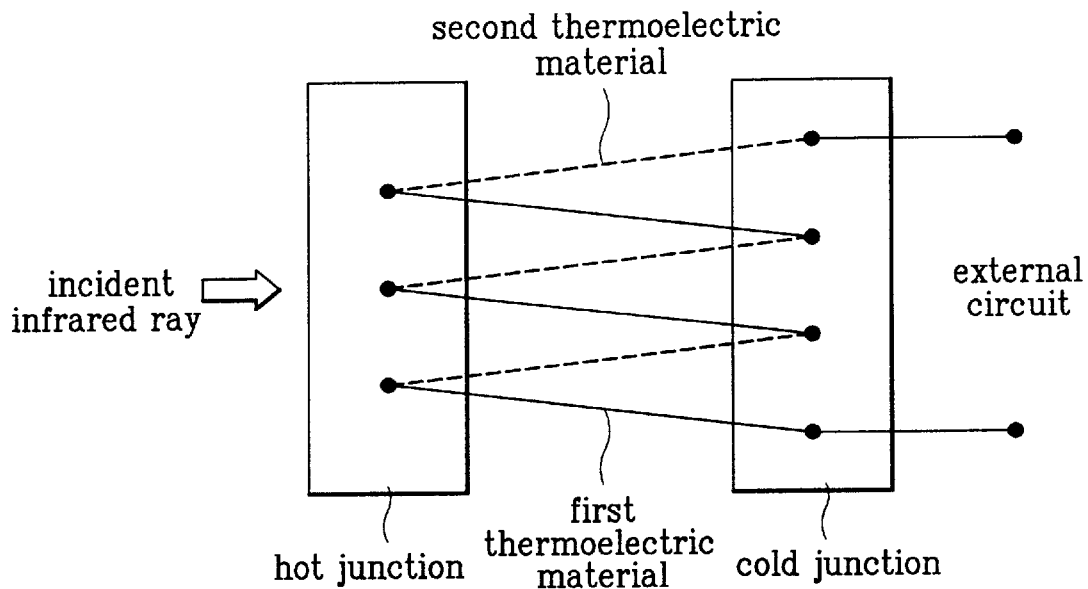
FIG. 1 illustrates a basic structure of a related art thermopile sensor.
Figure 2:
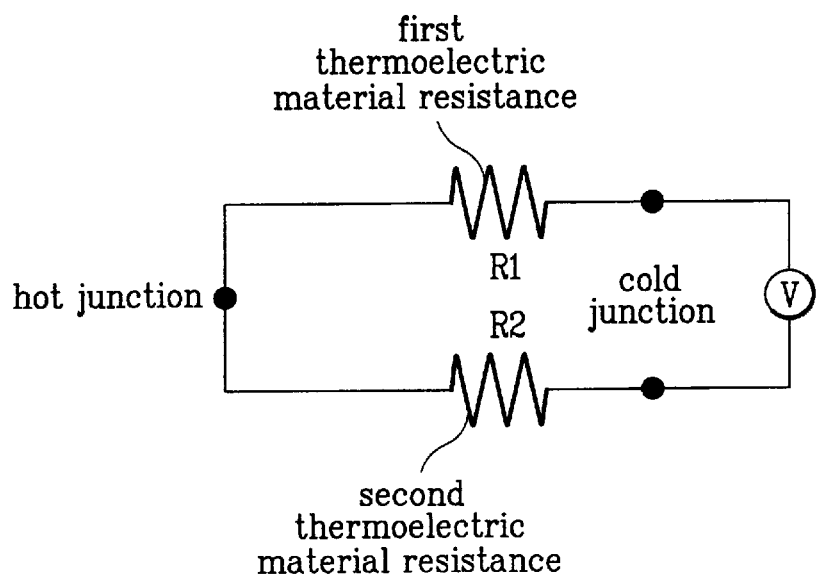
FIG. 2 illustrates an equivalent circuit for a related art thermopile sensor.
Figure 3:
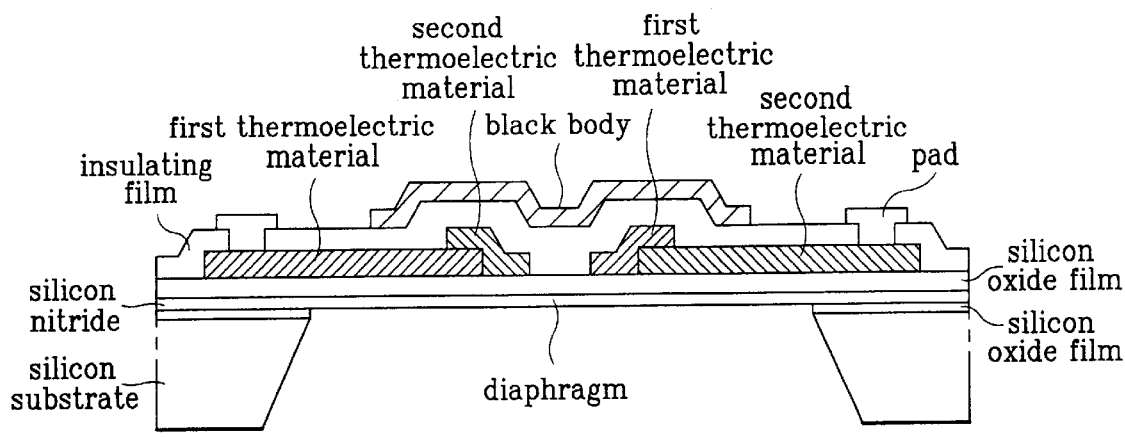
FIGS. 3 and 4 illustrate a section and a plan showing a structure of a related art thermopile sensor.
Figure 4:
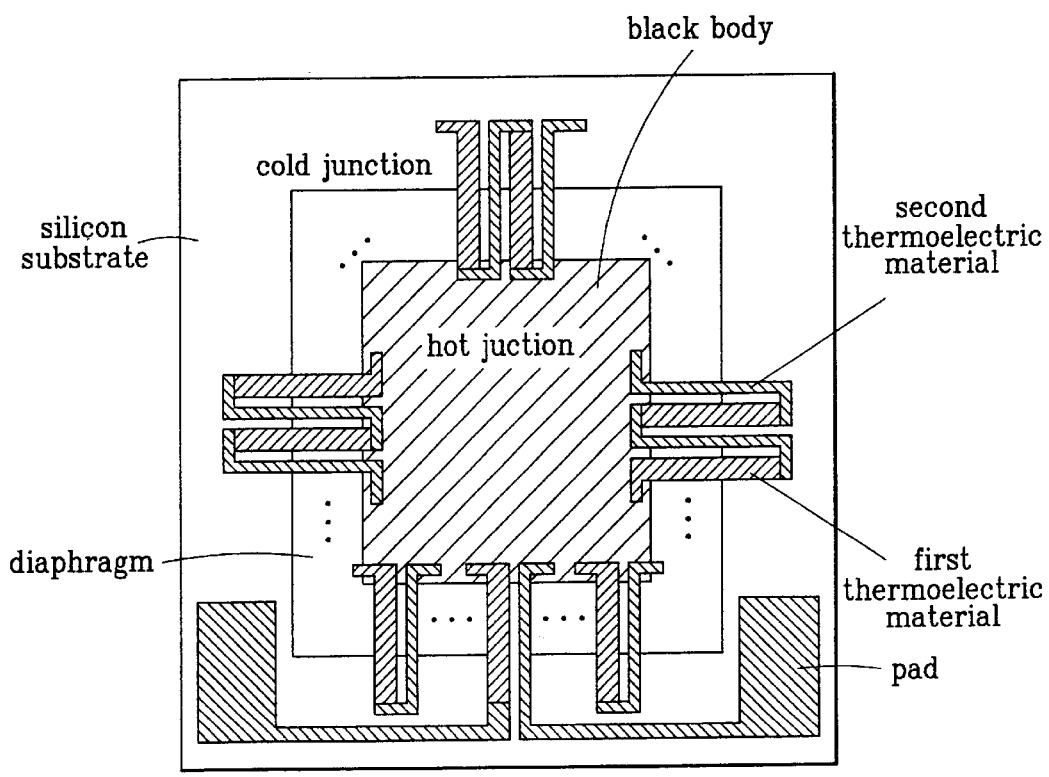

As shown in FIG. 2, the related art thermopile sensor has a semiconductor resistance $R_1$ and a metal resistance $R_2$ connected in series, wherein the internal resistance is substantially the semiconductor resistance $R_1$ since the metal resistance $R_2$ is negligible compared to the semiconductor resistance $R_1$. Because the thermopile sensor can not but have a total length of the thermocouples which is substantially long in view of a structure of the thermopile sensor, an overall internal resistance of the thermopile sensor also can not but be great.

Figure 7:
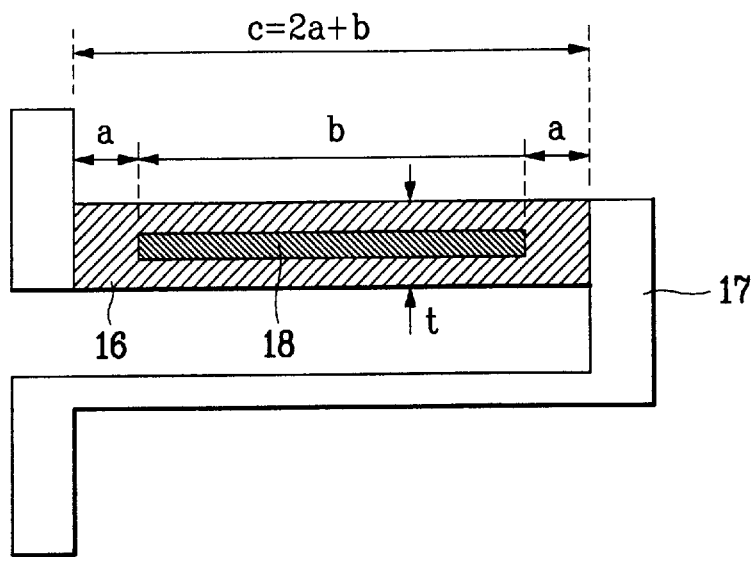
FIG. 7 illustrates a detailed view of "A" part in FIG. 6.
Figure 8:
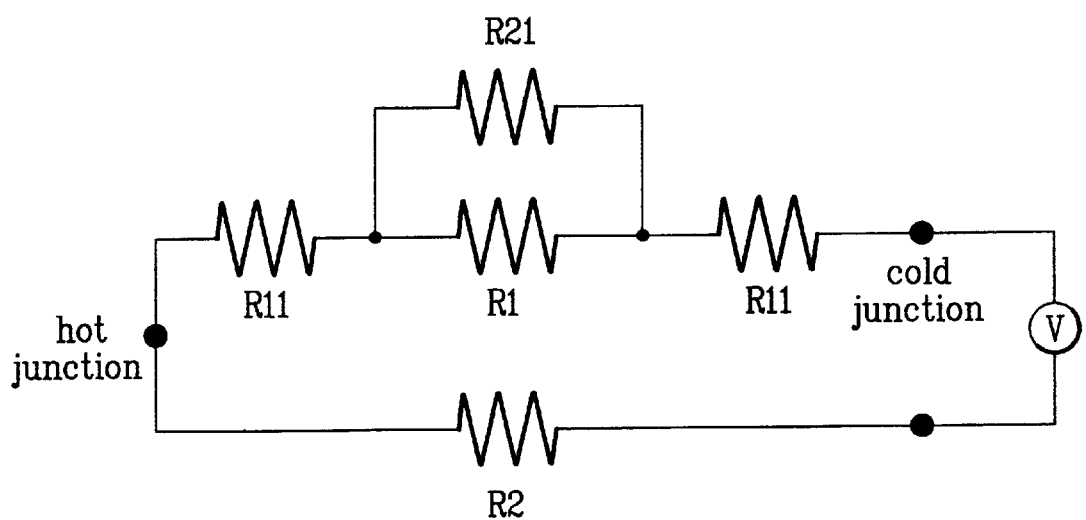
FIG. 8 illustrates an equivalent circuit for a thermopile sensor of the present invention.

FIG. 7 illustrates a detailed view of "A" part in FIG. 6.

Referring to FIG. 7, if the first thermoelectric material 16, a semiconductor, has specific resistance ρ, a thickness t, a line width w, a length c, the internal resistance $R_{T1}$ of the related art thermopile sensor can be expressed as follows.

$$R_{T1} = \rho \cdot \frac{c}{w \cdot t} = \rho \cdot \frac{(2a+b)}{w \cdot t}$$

And, the internal resistance $R_{T2}$ of the related art thermopile sensor can be expressed as follows.

$$R_{T2} = 2\left(\rho \cdot \frac{a}{w \cdot t}\right)$$

As a<b, $R_{T1}>R_{T2}$, eventually. That is, of the resistance of the first thermoelectric material 16, a portion('b' region) of the resistance the metal conductor 18 is stacked is negligible, the internal resistance is reduced as much. Accordingly, the-internal resistance of the sensor can be adjusted with easy by adjusting a length of the metal conductor 18, to adjust a line width 'a' of the thermocouple.

Figure 9:
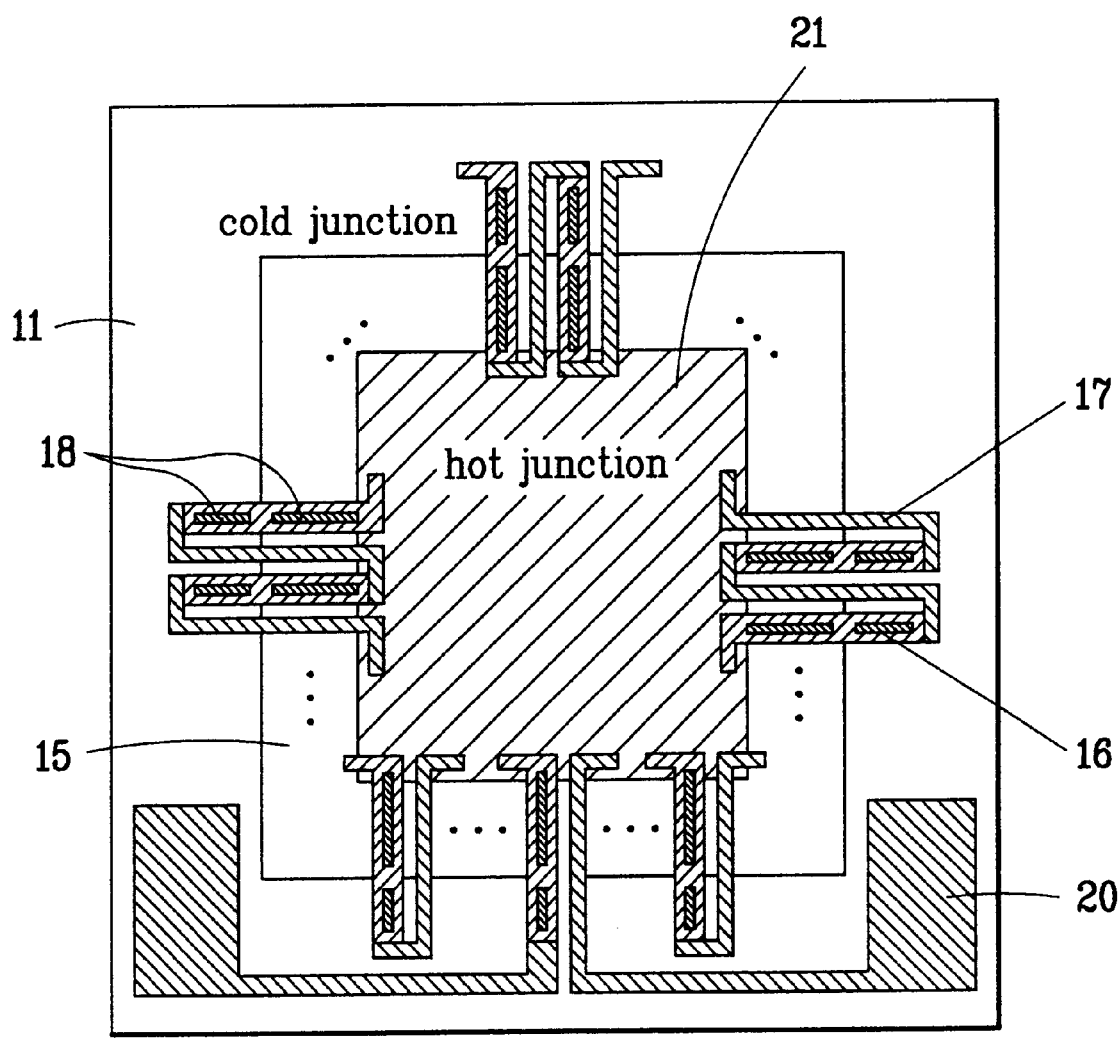
FIGS. 9 illustrates a plan view showing a structure of a thermopile sensor in accordance with a second preferred embodiment of the present invention; and, FIG. 10 illustrates a flow chart showing the steps of a method for fabricating a thermopile sensor of the present invention.

FIGS. 9 illustrates a plan view showing a structure of a thermopile sensor in accordance with a second preferred embodiment of the present invention.

Referring to FIG. 9, the thermopile sensor in accordance with a second preferred embodiment of the present invention includes a plurality of metal conductors 18 formed on a first thermoelectric material 16 for preventing transfer of a heat of an incident infrared ray from a hot junction to a cold junction through the metal conductor. Though the metal conductor 18 is formed in a form of stripe in the first embodiment of the present invention, the metal conductor 18 is divided into many pieces in the second embodiment of the present invention, for reducing, not only the internal resistance, but also a sensitivity loss of the sensor caused by the metal conductor 18. The metal conductor 18 is formed only on a region of a surface of the first thermoelectric material 16 except a portion in contact with the second thermoelectric material 17. Since the metal conductor 18 is not formed over a boundary portion of the substrate 11 and the hole the diaphragm 15 is exposed thereto, the heat transfer from the hot junction to the cold junction through the metal conductor 18 can be reduced.

Figure 10:
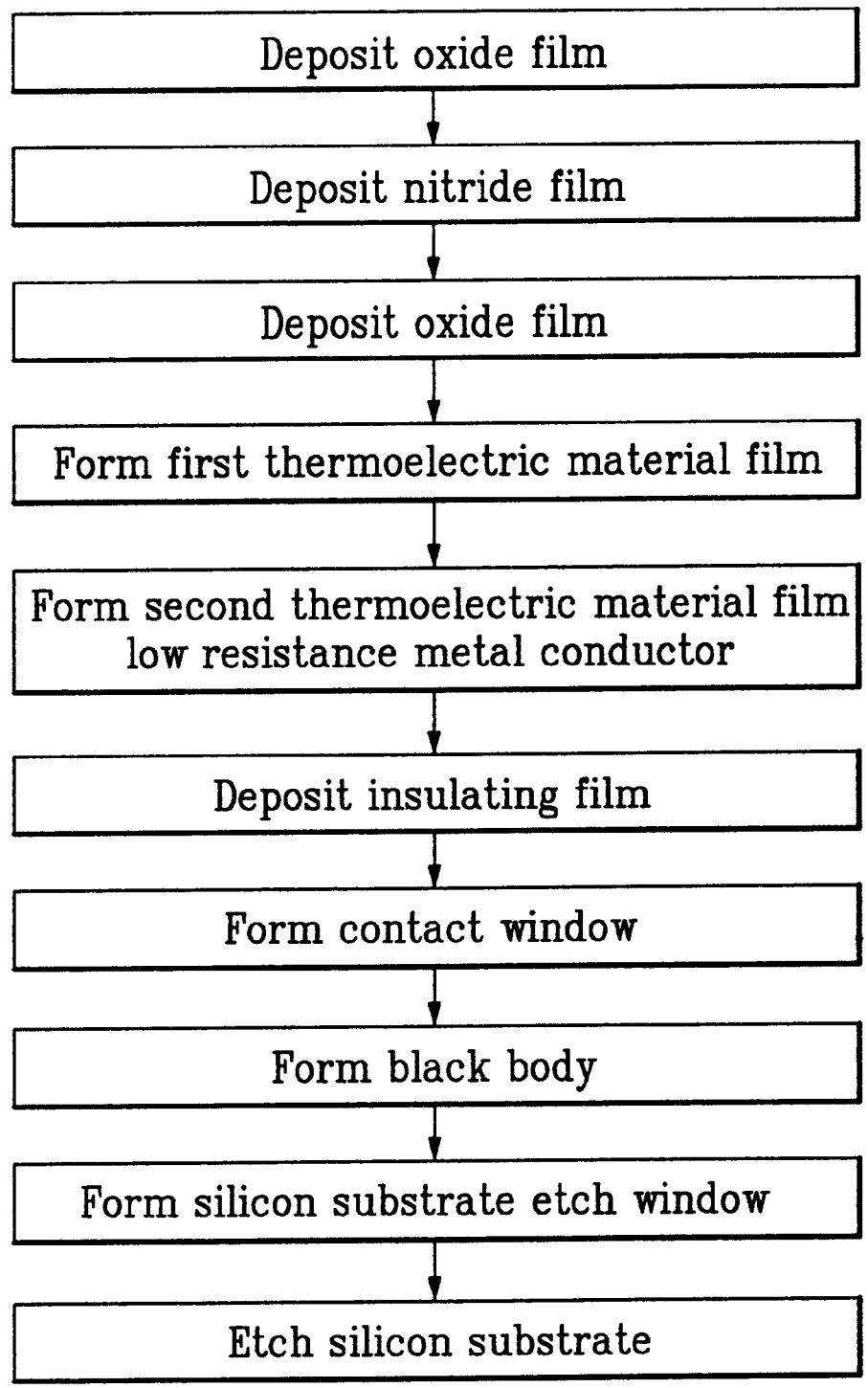

FIG. 10 illustrates a flow chart showing the steps of a method for fabricating a thermopile sensor of the present invention.

Referring to FIG. 10, the method for fabricating a thermopile sensor of the present invention starts with the step of selecting a silicon substrate of (100) crystal orientation as a substrate 11, for back-side etching in a later fabrication process. Then, a first oxide film 12 is deposited on both sides of the substrate 11 to approx. 2000 Å by thermal oxidation, and a nitride film 13 is deposited on the first oxide film 12 to 3000 Å by LPCVD. The nitride film 13 is used as an etch mask in etching the substrate 11, as well as an etch stop layer for stopping the etching. Then, a second oxide film 14 is deposited on the nitride film 13 to approx. 7000 Å by LPCVD. Thus, a diaphragm composed of the oxide film/the nitride film/the oxide film(ONO; oxide/nitride/oxide) is formed so that residual stresses of the films are compensated by each other, to provide a mechanically stable diaphragm. That is, in general, as a general oxide film has a compressive stress, and an LPCVD nitride film has a tensile stress, the stresses are compensated by each other. After formation of the diaphragm 15, a first thermoelectric material is deposited, and patterned on the second oxide film 14 over the substrate 11. And, alike the first thermoelectric material 16, a second thermoelectric material 17 is deposited and patterned, and a metal conductor 18 is formed on the first thermoelectric material 16 to a required length. The first thermoelectric material 16 is a semiconductor, and the second thermoelectric material 17 and the metal conductor 18 are conductors. Then, a protection film 19 is formed on an entire surface, inclusive of the first and second thermoelectric materials 16 and 17, and the metal conductor 18 for protection of the sensor device from an external environment, and a pad 20 is formed to be in contact with the thermocouple to connect an output from the sensor to an external circuit. Then, a black-body 21 is formed for absorbing an infrared ray, and a back-side of the silicon substrate 11 is etched, to expose the diaphragm 15. In this instance, potassium hydroxide(KOH) water solution is used as the etch solution, to proceed the etching in a direction tilted by 54.74° from a bottom of the substrate 11 as the potassium hydroxide water solution almost does not etch in an (111) orientation of a silicon crystalline direction. And, because the silicon nitride film 13 is not almost etched in the potassium hydroxide water solution, the silicon nitride film 13 is used, not only as an etch mask, but also an etch stop layer for solving a problem of a non-uniform etch surface which is caused when the entire substrate 11 is not etched on the same time at an end of the etching. In the present invention, as the metal conductor 18 for reducing a resistance is formed on the same time with the formation of the second thermoelectric material 17, the metal conductor 18 can be formed by using the present fabrication process only without any additional process, with easy.

The infrared ray sensor of a low resistance and a high sensitivity, and a method for fabricating the same of the present invention has the following advantages.

First, the formation of a metal conductor on the first thermoelectric material permits to reduce an internal resistance significantly, and maintain a high sensitivity.

Second, the simultaneous formation of the second thermoelectric material and the metal conductor eliminates necessity for a separate fabrication process.

Third, the reduction of the internal resistance permits to reduce Jhonson noise in an application circuit.

Fourth, the easy adjustment of the internal resistance of the sensor by adjusting a length of the metal conductor can improve a production yield since a range of error can be made smaller.

It will be apparent to those skilled in the art that various modifications and variations can be made in the infrared ray sensor, and the method for fabricating the same of the present invention without departing from the spirit or scope of the invention. Thus, it is intended that the present invention cover the modifications and variations of this invention provided they come within the scope of the appended claims and their equivalents.

What is claimed is:

1. An infrared ray sensor comprising:
   a substrate having a hole in a central region;
   a diaphragm formed on the substrate;
   a first and a second thermoelectric materials formed in regions of the diaphragm;
   a metal resistance layer formed in a region of a surface of the first thermoelectric material, wherein the metal resistance layer is formed only in a region of a surface of the first thermoelectric material except a region in contact with the second thermoelectric material; and
   a black body formed in a central region of the diaphragm.

2. An infrared ray sensor as claimed in claim 1, wherein the first thermoelectric material is a semiconductor, and the second thermoelectric material is a conductor.

3. An infrared ray sensor as claimed in claim 1, wherein the metal resistance layer is formed of a material identical to the second thermoelectric material.

4. An infrared ray sensor as claimed in claim 1, wherein the metal resistance layer has a form of at least one stripe.

5. An infrared ray sensor as claimed in claim 1, wherein the metal resistance layer is not formed over a boundary of the substrate and the hole.

6. An apparatus comprising:
   a diaphragm;
   a first thermoelectric layer selectively formed over the diaphragm;
   a second thermoelectric layer selectively formed over the diaphragm; and
   a conductor selectively formed on the first thermoelectric layer, such that the conductor avoids contact with the second thermoelectric layer.

7. The apparatus of claim 6, wherein the first thermoelectric layer is a semiconductor.

8. The apparatus of claim 6, wherein the second thermoelectric layer is a conductor.

* * * * *